(12) United States Patent
Cherko

(10) Patent No.: US 6,238,483 B1
(45) Date of Patent: May 29, 2001

(54) APPARATUS FOR SUPPORTING A SEMICONDUCTOR INGOT DURING GROWTH

(75) Inventor: Carl F. Cherko, St. Charles, MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 0 days.

(21) Appl. No.: 09/386,979

(22) Filed: Aug. 31, 1999

(51) Int. Cl.$^7$ .................................................. C30B 15/32
(52) U.S. Cl. ........................................... 117/218; 117/911
(58) Field of Search .......................... 117/13, 35, 208, 117/218, 902, 911, 932

(56) References Cited

U.S. PATENT DOCUMENTS

| | | | |
|---|---|---|---|
| 4,352,785 | 10/1982 | Schellin | 422/249 |
| 4,929,118 | * 5/1990 | Anderson | 403/356 |
| 5,135,727 | 8/1992 | Ibe | 422/249 |
| 5,207,992 | 5/1993 | Matsuo et al. | 422/249 |
| 5,277,934 | 1/1994 | Gilbert et al. | 427/249 |
| 5,306,387 | 4/1994 | Fusegawa et al. | 156/168.1 |
| 5,833,750 | 11/1998 | Mizuishi et al. | 117/218 |
| 5,910,216 | 6/1999 | Nakamura et al. | 117/218 |
| 5,932,007 | 8/1999 | Li | 117/208 |
| 5,935,328 | * 8/1999 | Cherko et al. | 117/218 |
| 5,948,154 | 9/1999 | Hayashi et al. | 106/31.48 |
| 5,961,715 | 10/1999 | Ikeda | 117/13 |
| 5,964,941 | 10/1999 | Iino et al. | 117/13 |

FOREIGN PATENT DOCUMENTS

| | | |
|---|---|---|
| 41 23 337 | 1/1993 | (DE) . |
| 792 953 | 9/1997 | (EP) . |
| 11033810 | 2/1999 | (EP) . |
| 949 361 | 10/1999 | (EP) . |
| 40317391 | * 7/1991 | (JP) . |

OTHER PUBLICATIONS

700 IBM Technical Disclosure Bulletin, vol. 17, No. 5, Oct. 1974, *Seed Holder for Crystal Growth*, XP–002153090, p. 1353.

* cited by examiner

Primary Examiner—Benjamin L. Utech
Assistant Examiner—Matthew Anderson
(74) Attorney, Agent, or Firm—Senniger, Powers, Leavitt & Roedel

(57) ABSTRACT

A device for supporting a semiconductor ingot during growth of the ingot. The device includes a chuck in which is mounted a seed. The seed includes an elongate rod having one end projecting from the chuck for growth of the ingot thereon. A latch pin secures the seed in the chuck in a removable manner. The chuck is suspended in a semiconductor furnace. The chuck, seed and latch pin and interengaged in a manner to reduce forming flaws in the ingot.

39 Claims, 6 Drawing Sheets

APPARATUS FOR SUPPORTING A SEMICONDUCTOR INGOT DURING GROWTH

BACKGROUND OF TE INVENTION

The process of manufacturing silicon semiconductor wafers is well known in the industry. The principal method of manufacturing them is the Czochralski (CZ) method. Generally the process includes immersing a portion of a seed crystal such as a monocrystalline silicon crystal into molten semiconductor material, such as polycrystalline silicon and, a single crystal ingot with zero dislocations grows from the seed. The seed and growing ingot are slowly moved upwardly and extracted from the molten semiconductor material allowing the crystal to grow. Growth is continued until the proper ingot size is achieved.

The CZ method has been very effective at growing semiconductor crystals. However, as crystals have gotten larger in diameter and longer and crystal growing processes are operating at higher temperatures, manufacturing and product problems have been encountered. Further, as price competition for semiconductor wafers has increased, any cost savings that can be achieved are highly desirable.

Figure 8:
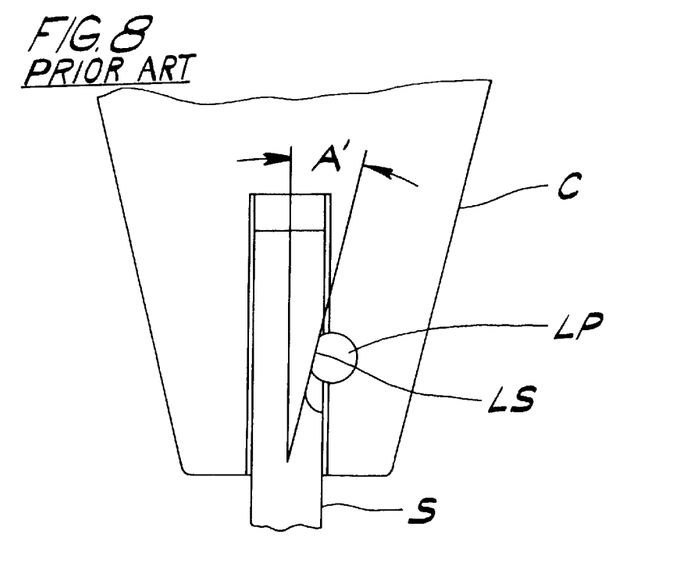
FIG. 8 is an enlarged schematic view of a prior art chuck, latch pin and seed arrangement.

A current method of crystal production includes holding the seed, which is in the form of an elongate rod, in a chuck which is suspended from a cable. The seed is releasably retained in the chuck so when the ingot is completed, it can be easily separated from the chuck for further processing. A typical retention device for retaining the seed in the chuck is a latch pin that is interengaged with a corresponding notch previously formed in the seed. The pin engages a generally planar notch latch surface that is tapered. The degree of taper, as seen in FIG. 8, is such as to provide a taper lock whereby friction locks the seed in place. This system has worked well until the ingots have gotten larger and therefore heavier or as the crystal growing process has been conducted at higher temperatures. The heavier the crystal and the higher the crystal growing process temperature, the higher the probability of a failure.

Two modes of failure have occurred. First, the taper lock arrangement can slip and second, the seed can break ruining the crystal.

Slippage of the ingot of as little as 0.002" can result in a scrap crystal. Such slippage results in waves in the molten semiconductor material in the furnace crucible which then creates a flaw in the crystal. Slippage appears to be the result of the formation of a coating on the chuck that holds the seed. This coating is believed to be silicon carbide which forms on the chuck surface engaged by the seed during crystal growth. The coating results in a large disparity between the static and dynamic coefficients of friction between the two parts. If the seed begins movement relative to the chuck, this disparity in the coefficients of friction will allow the ingot to slip more than if they were not as disparate. Movement will continue until the friction is increased by the taper lock effect of the latch pin against the seed which additionally increases the compressive force on the seed. The slippage causes a crystal flaw at least partly because it creates minor waves in the molten semiconductor material. The formation of silicon carbide or other compound on the surfaces currently results in a higher probability of failure requiring more frequent replacement of the chuck to maintain an acceptable risk level. The layer grows more with each use, and thus increases the probability of failure with each additional use.

If the seed breaks, the crystal is also ruined since it falls into the molten semiconductor material. A chuck C, latch pin LP and seed S currently used in the art are seen in see FIG. 8. The seed S is prone to breakage. Breakage is believed to be due at least in part to the small angle A' that the latch surface LS of the notch is positioned at, which is about 11° from the longitudinal axis of the seed. Such a small angle increases the compressive force applied to the seed S by the latch pin LP. Additionally, the contact between the mating surfaces of the seed and the latch pin may encourage breaking of the seed S under load. In some cases, both are made of materials having a high modulus of elasticity which is now believed to encourage breakage because of a lack of compressibility resulting in a narrow width zone of contact.

Two ways of reducing the incident rates of these failure modes is to either make the parts larger and therefore stronger or throw the parts away after fewer or even one use. However, these are expensive alternatives but would lower the probability of failure. Thus, there is need for an improved chuck and seed for producing semiconductor ingots.

SUMMARY OF THE INVENTION

Among the several objects and features of the present invention may be noted the provision of an apparatus for supporting a semiconductor crystal ingot during growth of the crystal that overcomes the aforementioned problems; the provision of such an apparatus that reduces the probability of failure thereby increasing the usable life of the apparatus; the provision of such an apparatus that does not require changing current equipment for its use; the provision of such an apparatus that does not increase the cost of producing semiconductor crystal ingots; the provision of such an apparatus that is simple for an operator to use; the provision of such an apparatus that improves manufacturing efficiency; the provision of a latch pin that reduces the risk of breaking the seed; and the provision of a seed that reduces the risk of slippage of the ingot and breakage of the seed.

The present invention is directed to a seed for commencing growth of a semiconductor ingot and supporting the ingot during growth. The seed comprises an elongate rod having a latch end and a growth end and has a notch extending generally transverse to a longitudinal axis of the rod. The notch has a latch surface portion at least partially defining the notch with a contour such that at least a portion of the latch surface portion lies at an angle of at least about 30° from the longitudinal axis of the rod.

The present invention also involves the provision of a device for suspending a semiconductor ingot during formation of the ingot. The device includes a chuck with a seed receiving socket extending generally longitudinally of the chuck and opening onto a first end thereof. A latch pin is mounted in the chuck and has a support surface. A seed is positioned in the socket and removably secured therein. The seed has an end thereof projecting from the first end of the chuck and has a transverse notch extending into a side surface. The notch is at least partially defined by a latch surface having at least a portion in engagement with the support surface portion at an angle of contact, the angle of contact between the latch surface and the support surface is such as to prevent locking therebetween.

A further aspect of the present invention is the provision of a latch pin for attaching a semiconductor seed crystal to a chuck used to support a semiconductor ingot during ingot growth. The latch pin comprises an elongate shaft having a socket extending into the shaft and opening on an exterior surface of the shaft, the shaft is made of refractory metal. A pillow is removably mounted in the socket and has a first surface extending outwardly from the shaft and is adapted for engagement with a portion of a semiconductor seed. The pillow has a modulus of elasticity of less than about $2.1 \times 10^6$ psi.

The present invention also involves the provision of a device for suspending a semiconductor ingot during formation of the ingot. The device includes a chuck with a seed receiving socket extending generally longitudinally of the chuck and opening onto a first end thereof. A latch pin is mounted in the chuck and a pillow is mounted to the latch pin and has a support surface portion. A seed is positioned in the chuck socket and is removably secured therein. The seed has an end thereof projecting from the first end of the chuck and also has a transverse notch extending into a side surface of the seed. The notch is at least partially defined by a latch surface having at least a portion in engagement with the support surface portion. The chuck, latch pin, pillow and seed each have a coefficient of thermal expansion with values of the coefficients of thermal expansion having variation therebetween of less than about 50%.

Other objects and features will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION

Figure 1:
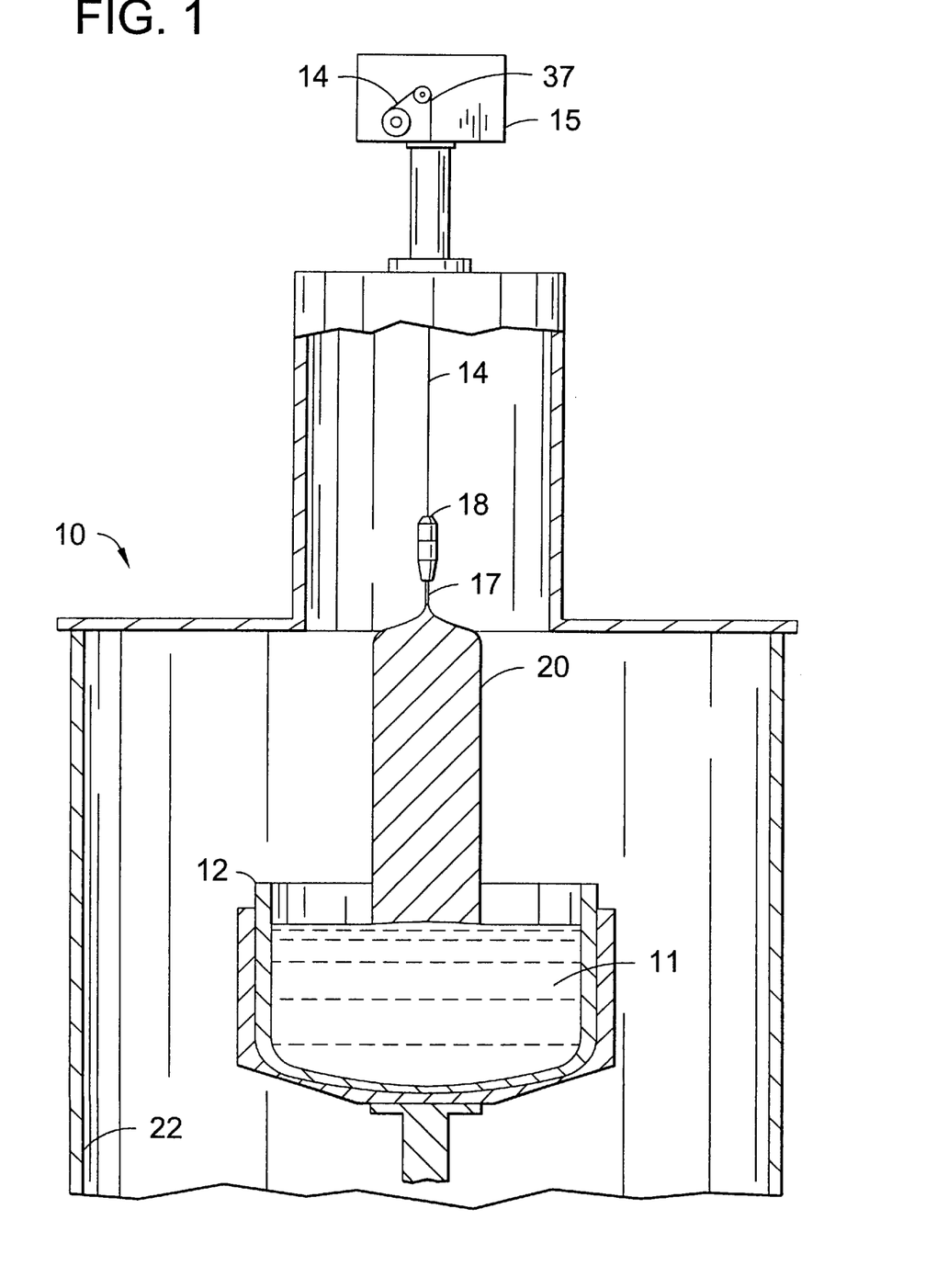
FIG. 1 is a schematic partial cross section of a furnace used to produce semiconductor ingots from which semiconductor wafers are made.

As best seen in FIG. 1, a furnace, designated generally as 10, is provided for the manufacture of semiconductor ingots such as by the Czochralski (CZ) method. This method is well known in the industry and generally involves having a molten semiconductor material 11 such as polycrystalline silicon, hereinafter referred to as silicon, in a crucible 12 in the furnace 10. A cable 14 is suspended over the crucible 12 and is attached to a winch 15 for slowly moving the cable upwardly. In an alternative embodiment, a rigid shaft could be used in place of the cable 14. A seed 17 is secured to the cable 14 via a chuck 18. At the beginning of crystal growth, the seed 17 is partially immersed in the molten semiconductor material 11 such as silicon and when the crystal ingot 20 starts to form, the chuck 18, seed 17 and the ingot 20 are slowly moved upward with the silicon crystallizing increasing the length of the ingot 20. Ingot growth and movement is continued until the ingot 20 is complete. After completion of ingot growth and cooling, the ingot 20 and seed 17 are removed from the furnace 10 and chuck 18. The ingot 20 can then be processed into wafers. The processes of crystal (ingot) growth and wafer production are well known in the industry.

The furnace 10 includes a housing 22 with a source of heat (not shown) applied to the crucible 12. The heat is preferably from an electrically resistive heater which is in heat transfer relation with the crucible 12. The crucible 12 is suitably mounted for rotation in the housing 22. Such a furnace 10 that can accommodate crucible 12 is available from Ferrofluidics Corp. as model CZ-150.

Figure 2:
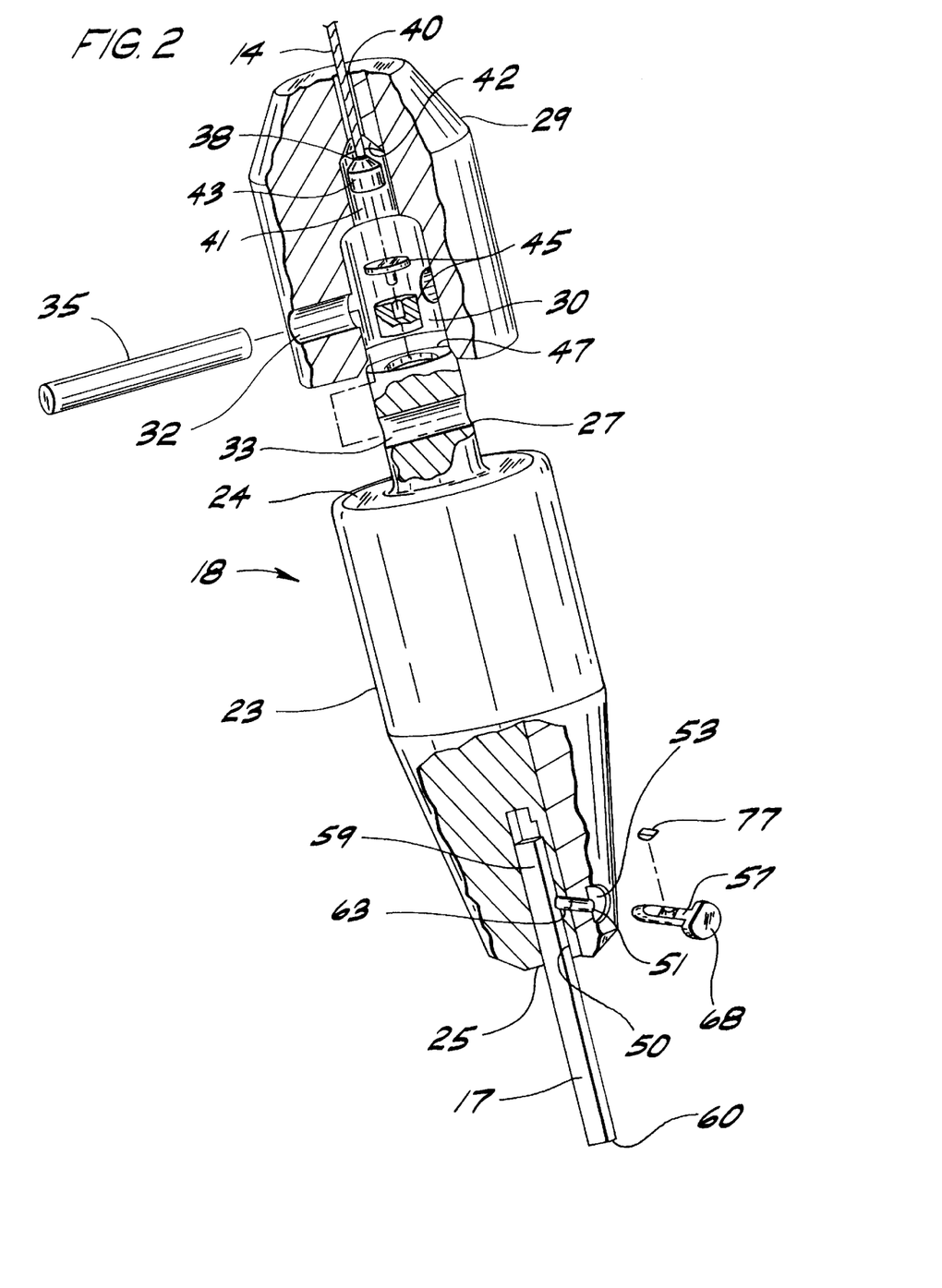
FIG. 2 is an enlarged exploded perspective view of a chuck used for suspending a semiconductor ingot during the manufacturing process with sections broken away to show internal details.

The chuck 18 is best seen in FIG. 2. The chuck head 23 is preferably made from a heat resistant graphite material such as grades CZ3L or Al2RL manufactured by SGL Carbon Company. Means is provided to releasably secure the chuck 18 to the cable 14. As seen in FIG. 2, the chuck 18 includes a chuck head 23 with opposite ends 24, 25 with a shank 27 projecting from the end 24. A cap 29 which preferably is made from fused quartz is suitably removably secured to the shank 27. The cap 29 includes a longitudinal bore 30 sized and shaped to receive the shank 27 in a snug fit. The cap 29 includes an elongate hole 32 passing transversely thru the cap and opening onto opposite sides thereof The hole 32 opens into the bore 30. Likewise, the shank 27 has an elongate aperture 33 extending transversely therethrough. As shown, a graphite dowel pin 35 extends through the hole 32 and aperture 33 to removably secure the cap 29 to the chuck head 23. The cable 14 is preferably of a 7×7×7 tungsten type and has one end 37, FIG. 1, secured to the winch 15 which is operable to move the chuck 18 vertically, both up and down, upon command. A preferred winch 15 is supplied with the furnace 10 by Ferrofluidics Corp. The other end 38 of the cable is a free end and is secured to the chuck 18 via the cap 29 and hence the chuck head 23. As shown, the end 38 of the cable 14 extends through a hole 40 into a pocket 41 that opens into the bore 30. There is a shoulder 42 between the pocket 41 and hole 40. The end 38 of the cable 14 has a cable clamp 43 secured thereto to engage the shoulder 42 and thus secure the cap 29 to the cable 14. Insulators 45 are mounted in the bore 30 between a free end 47 of the shank 27 and the clamp 43 for shielding the free end 38 of the cable 14 from damaging thermal loads radiated by the chuck head 23.

The rate of movement of the chuck 18 during crystal formation is in the range of about 0.3 mm/min. through about 2 mm/min. and will depend on several factors. The rate will be determined in large part by the diameter of the ingot 20 to be grown and the thermal conditions present in the furnace 10.

The chuck 18 has a socket or bore 50 opening onto the free end 25. Preferably, the bore 50 is generally coaxial with the longitudinal axis of the chuck 18 and also the cable 14 above the chuck. It is also preferred that the lower end of the chuck 18 be tapered for unobstructed viewing of an end 60 of the seed 17.

Figure 5:
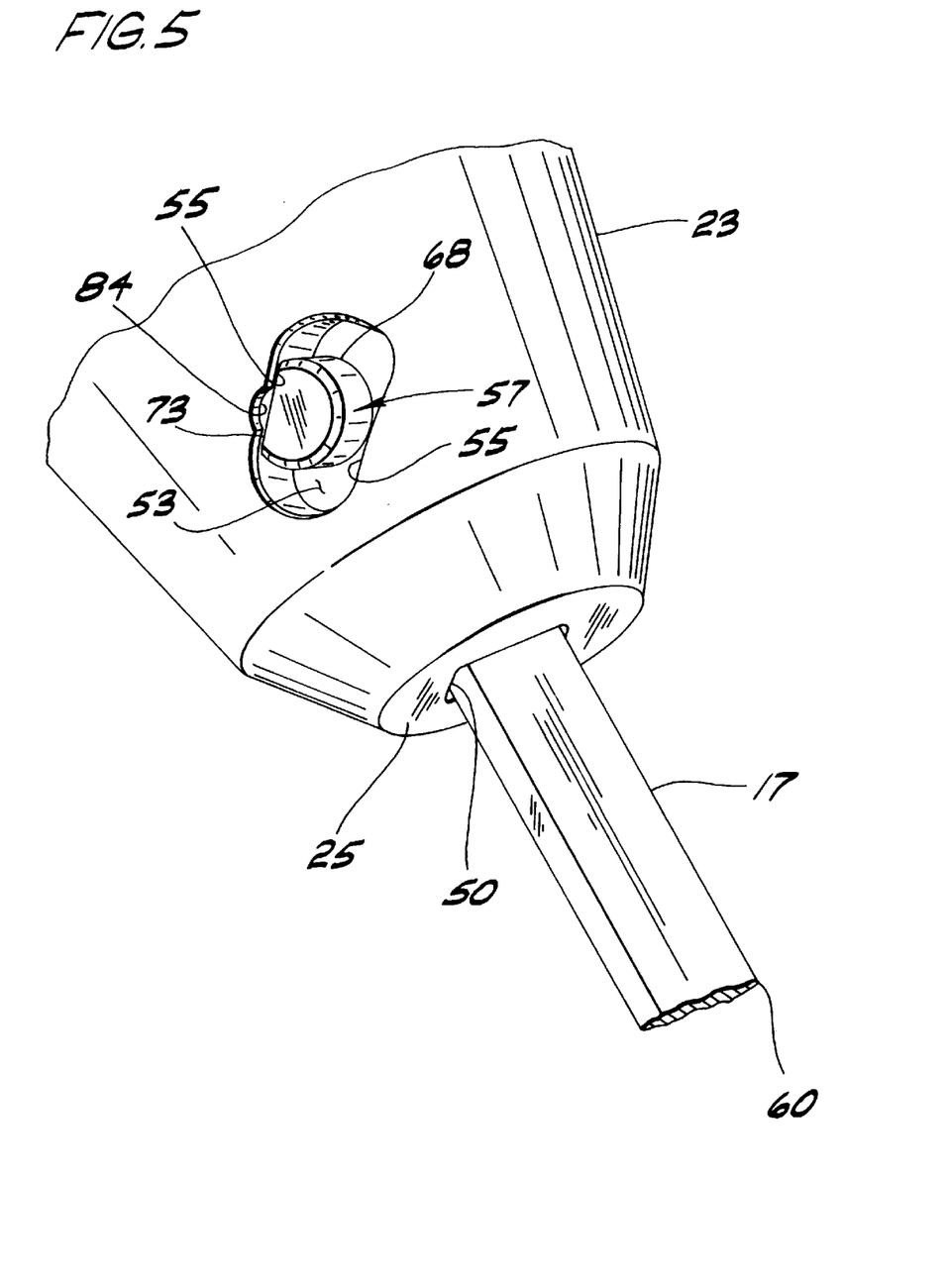
FIG. 5 is an enlarged perspective fragmentary view of a lower portion of the chuck showing details of the chuck, seed and latch pin.

The chuck 18 is also provided with an elongate hole 51 that extends transversely of the longitudinal axis of the chuck. For manufacturing ease, the hole 51 can open onto opposite sides of the chuck 18. One or both ends of the hole 51 can open into an elongate recessed slot 53 that opens onto the exterior surface of the chuck 18. Preferably, the slot 53 is defined by at least one, and as shown a pair of generally opposed flat surfaces 55, FIG. 5. Preferably, the hole 51 intersects the bore 50 and is positioned such as to have at least about 30% and preferably at least about 50% of its transverse cross sectional area within the bore 50. By having the hole 51 and bore 50 intersect, a significant portion of the combined cross sectional area of a latch pin 57 and pillow 77 in a plane transverse to the longitudinal axis of the latch pin 57 is exposed in the bore 50 when installed. Preferably the combined exposed cross sectional area is at least about 30% and preferably at least about 50% of the transverse cross sectional area of the latch pin 57.

The seed 17 can be any suitable seed crystal. Preferably the seed 17 is elongate and in the shape of an elongate rod having a latch end 59 and a growth end 60. The seed 17 can have any suitable transverse cross sectional shape, e.g., generally round, rectangular, square (FIG. 3), etc. The seed 17 is sized and shaped to fit snugly in the bore 50 and has a transverse cross sectional shape corresponding to the transverse cross sectional shape of the bore 50. The length of the seed 17 is such that when installed in the bore 50, at least about 110 mm projects outwardly from the free end 25 of the chuck 18. It is also preferred that at least about 70 mm of seed length be within the bore 50.

Figure 3:
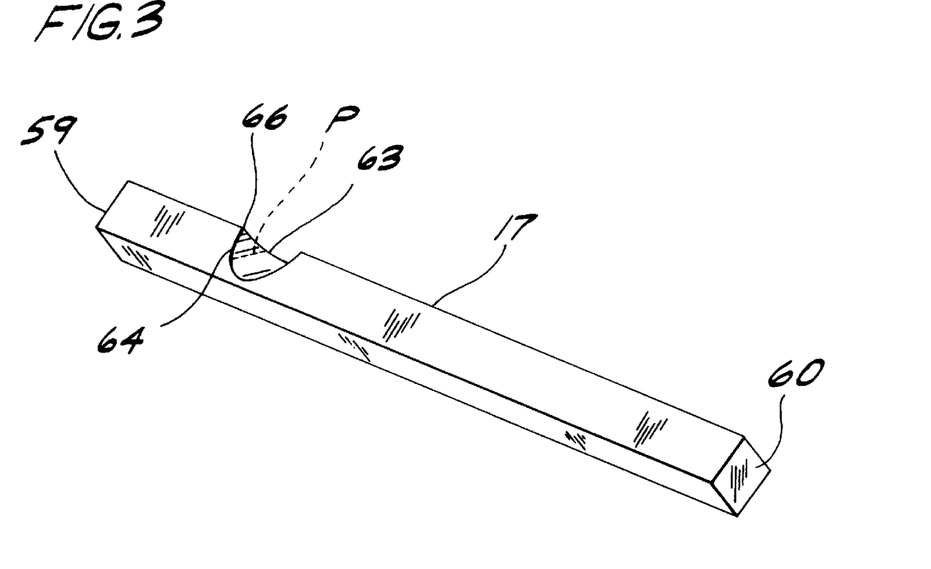
FIG. 3 is an enlarged perspective view of a seed.
Figure 6:
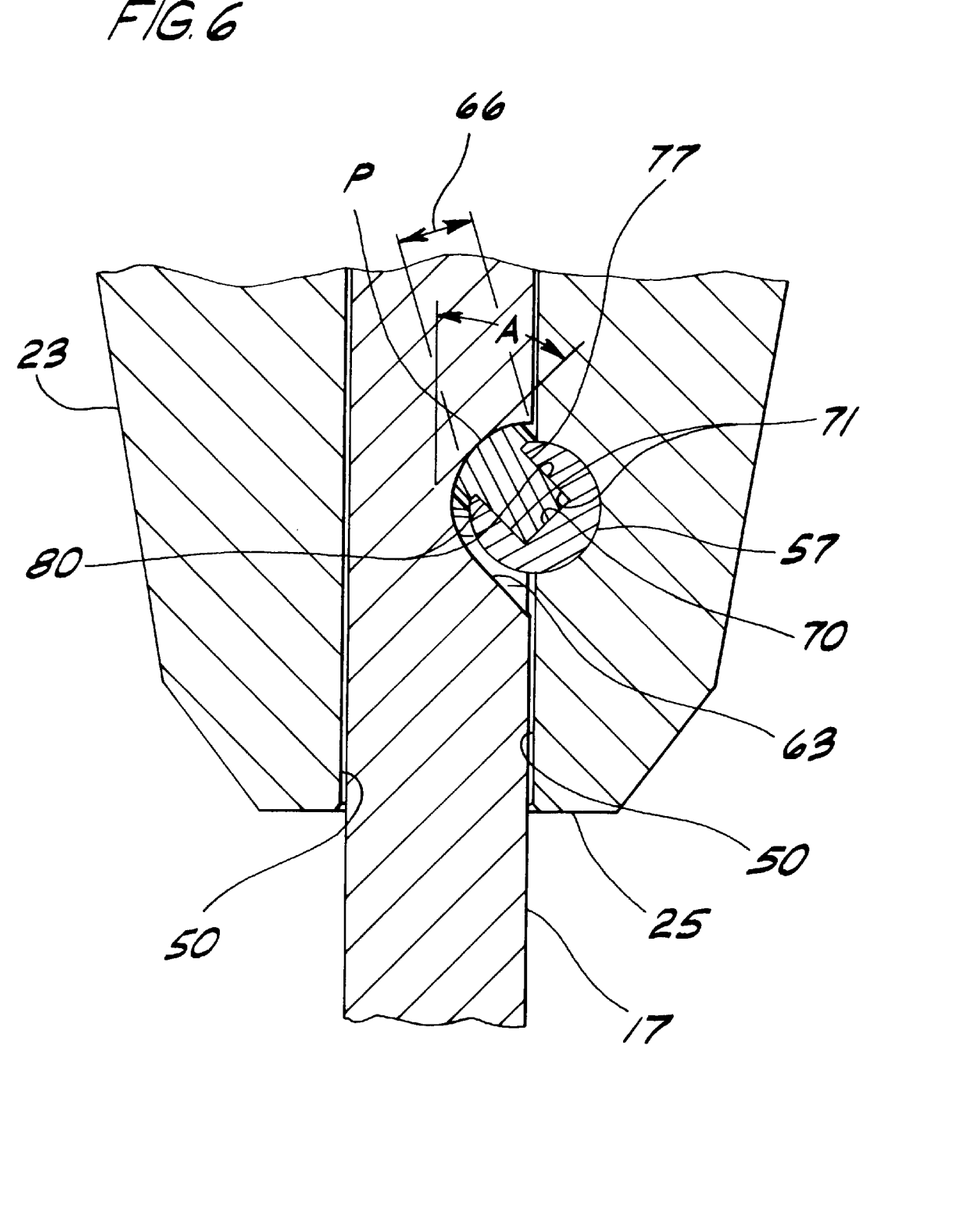
FIG. 6 is an enlarged sectional view of a lower portion of the chuck.

As seen in FIGS. 3, 6, a notch 63 is provided in the seed 17 adjacent the latch end 59. Preferably the notch 63 is orientated generally transverse to the longitudinal axis of the seed 17 and extends inwardly from the exterior surface toward the center or longitudinal axis of the seed. The notch 63 is defined at least partially by a latch surface 64 positioned at the top end of the notch 63 and adjacent the latch end 59 of the seed 17 and in use faces at least partially downwardly. The latch surface portion 64 is positioned and shaped to engage a portion of the latch pin 57 as hereinafter described. Also, it is preferred that the notch 63 be contoured such as to not have any sharp corners that would produce an undesirable stress concentration factor. Preferably, the transverse shape (FIGS. 3, 6) of the latch surface 64 is arcuate and more preferably is an arc of a circle with the latch surface 64 size being in the range of about 45° through about 180° of a circle and having a radius in the range of about 5 mm through about 8 mm and preferably about 7 mm through about 7.5 mm. The latch surface 64 has at least a portion 66, FIGS. 3, 6, thereof starting at a position P and extending to the outer surface of the seed 17. The portion 66 faces generally downwardly having at least a portion thereof at an angle A sufficient of at least about 30°, preferably at least about 45° and most preferably at least about 60° relative to the longitudinal axis of the seed 17. It is preferred that at least about 50%, preferably at least about 70% and most preferably at least about 85% of the depth of the notch 63 be outward of the position P where the angle A equals or exceeds the aforementioned values. The angle A, on a curved latch surface 64, would be measured between a line tangent to the latch surface at position P and the longitudinal axis of the seed 17.

Figure 4:
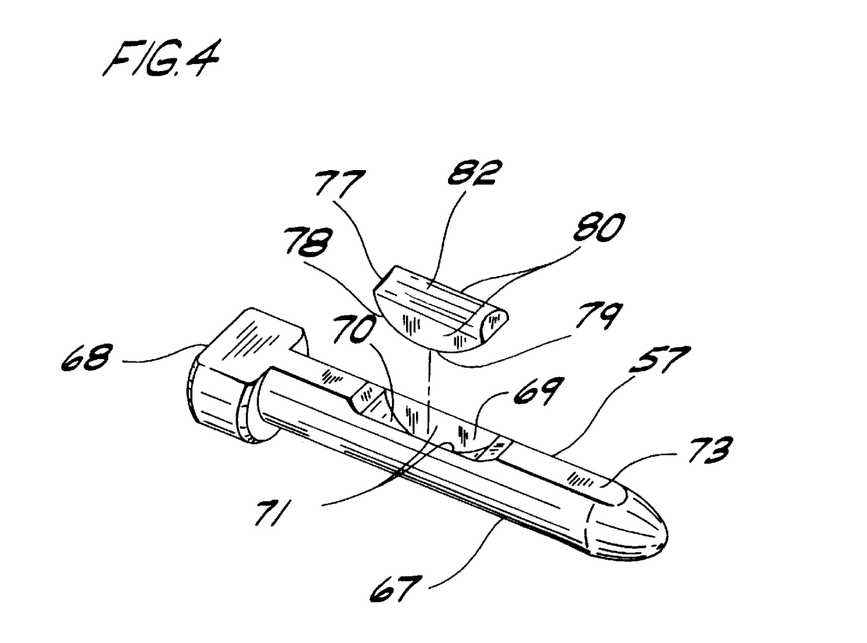
FIG. 4 is an enlarged exploded perspective view of a latch pin.

The latch pin 57 includes a shaft 67 and a head 68 positioned at on one end of the shaft (FIG. 4). The shaft 67 is elongate and includes a socket 69 extending transversely into the shaft 67. Preferably the socket 69 is defined by an arcuate bottom surface 70 and two generally parallel and spaced apart side surfaces 71. As shown, the latch pin 57 has a flat 73 on one side that extends longitudinally substantially the entire or the entire length of the shaft 67 and head 68. The transverse cross section shape of the head 68 corresponds generally to shape of the slot 53 in the chuck 18. The flat 73 on the head 68 will engage a flat surface 55 of the slot 53 to prevent rotation of the latch pin 57 when installed in the chuck 18. The free end of the shaft 67 can be tapered to facilitate installation of the latch pin 57 in the chuck 18. The shaft 67 and the head 68 are generally round, except for the flat 73, in transverse cross section. The radius of the shaft 67 is in the range of about 5 mm through about 8 mm and preferably in the range of about 6 mm through about 7 mm. Preferably the radius of the shaft 67 is less than the radius of the notch 63 to facilitate installation of the latch pin 57 into the chuck 23 and seed 17.

The latch pin 57 is preferably made of a material that is non-contaminating to the crystal growing process and includes refractory metals such as molybdenum, tungsten, tantalum, etc. A particularly preferred material is molybdenum.

The latch pin 57 includes a pillow or key 77, as best seen in FIGS. 4, 6, mounted to the shaft 67. The pillow 77 is adapted to engage the seed latch surface 64. As shown, the pillow 77 has a key 78 defined by an arcuate surface 79, extending arcuately convexly between opposite ends of the pillow 77, and two parallel side surfaces 80. The pillow 77 is generally in the shape of a so-called Woodruff key. The key 78 fits into the socket 69 and preferably fits snugly therein. The pillow 77 includes a latch or bearing surface 82 that when the pillow 77 is mounted in the shaft 67, the bearing surface 82 is positioned above or extends outwardly of the flat 73. The bearing surface 82 projects above the flat 73 a distance in the range of about 2 mm thru about 3 mm. The chuck hole 51 includes a keyway 84, FIG. 5, that provides clearance for the bearing surface 82 to pass thru when the latch pin 57 is installed in the chuck head 23. The contour of the bearing surface 82 is generally complementay the latch surface 64, arcuate or generally an arc of a circle in transverse cross section. Preferably the radius of the latch surface 64 is larger than the radius of the bearing surface 82 by at least about 1.5% when unloaded and the radius of the bearing surface is in the range of about 7 mm through about 8 mm.

The pillow 77 preferably has a modulus of elasticity, as measured at room temperature, less than that of the seed 17 and is less than about $2.1 \times 10^6$ psi and preferably in the range of about $1.6 \times 10^6$ psi through about $2.1 \times 10^6$ psi as measured at room temperature. The modulus of elasticity of the pillow 77 is in the range of about 2 through about 10% of the modulus of elasticity of the seed 17, also as measured at room temperature. The modulus of elasticity of the seed is preferably in the range of about $21 \times 10^6$ psi through about $23 \times 10^6$ psi as measured at room temperature.

Figure 7:
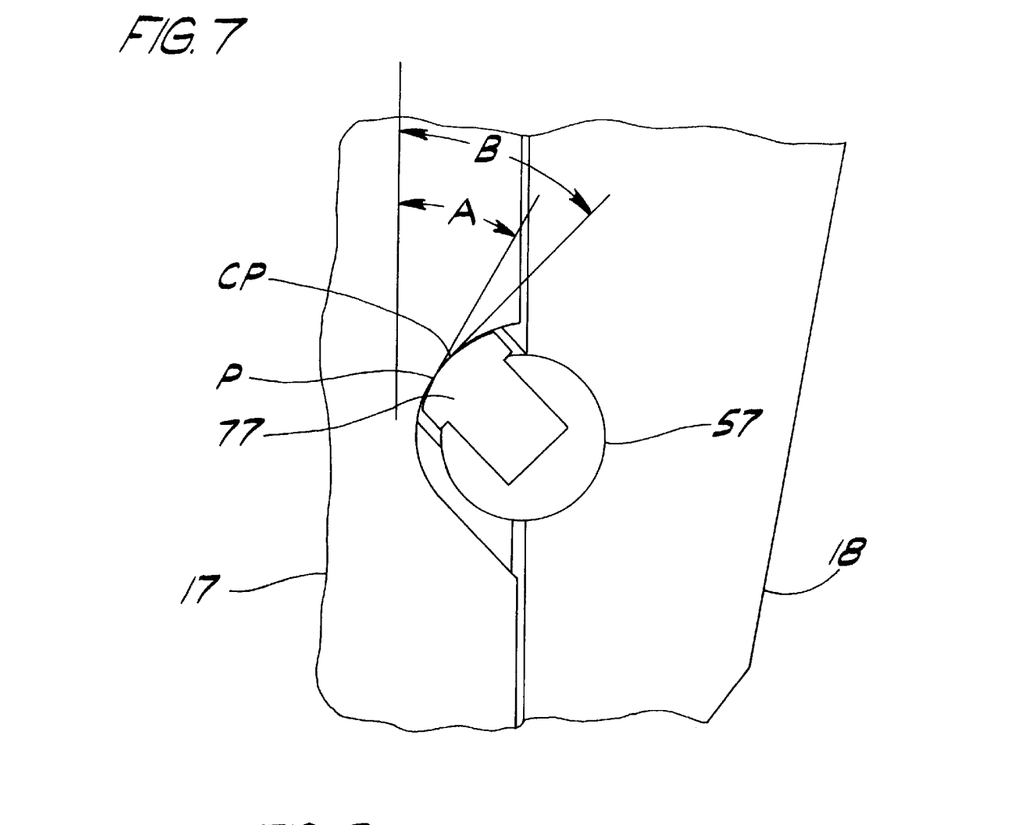
FIG. 7 is an enlarged schematic view of chuck, latch pin and seed with details out of proportion to illustrate the engagement of the latch pin and seed.

As seen in FIG. 6, the latch pin 57, through the bearing surface 82, and seed 17, through the latch surface 64, interengage to removably secure the seed 17 in the chuck 18. In a preferred embodiment, the bearing surface 82 engages the latch surface 64 to mechanically retain the seed 17 in the chuck 18 against relative longitudinal movement therein. Preferably friction between the seed 17 and the wall of the bore 50 does not play a significant role in the securement which would cause the seed 17 to self lock in the chuck head 23. Rather, it is preferred that the load of the ingot 20 be principally carried by the latch pin 57 in shear, i.e., the seed 17 is mechanically supported thru a combination of shear, bending and compressive stresses. The interengagement of the latch surface 64 and the bearing surface 82 is such as to prevent a taper or friction lock therebetween when the seed 17 is loaded. As shown, the pillow 77 and the latch surface 64 are contoured such that they engage starting at least at a position on the latch surface 64, and preferably on the bearing surface 82, at a position CP (FIG. 7) as described above. The contact between the bearing surface 82 and latch surface 64 is at the position CP which is preferably at an angle B of large enough to prevent locking between the surfaces and is at least about 30°, preferably in the range of between about 30° through about 60° and most preferably about 45°. If the latch surface 64 is curved at the position CP the angle B would be measured between a line tangent to the position CP and the longitudinal axis of the seed 17.

In a preferred embodiment of the present invention, the chuck head 23, seed 17, latch pin 57 and pillow 77 have similar linear coefficients of thermal expansion. This should reduce stress induced between tight fitting parts throughout the cycling of their temperature thru the broad range of temperatures to which they are exposed during operation of the crystal growing apparatus. It has been found that the coefficients of thermal expansion for a silicon seed 17 is about $5.2 \times 10^{-6}/°$ C., for Al2RL graphite it is about $5.4 \times 10^{-6}/°$ C., for molybdenum it is about $5.4 \times 10^{-6}/°$ C. and for SFG-2 graphite (available from POCO) it is about $7.7 \times 10^{-6}/°$ C. The coefficients of thermal expansion should be maintained for the seed 17, pillow 77, latch pin 57 and chuck head 23 within about 50% total variation from one another, preferably within about 20% total variation, more preferably within about 10% and most preferably within about 5% total variation.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A device for suspending a semiconductor ingot during formation of the ingot, said device including:
    a chuck with a seed receiving socket extending generally longitudinally of the chuck and opening onto a first end thereof;
    a latch pin mounted on said chuck and having a support surface;
    a seed positioned in the socket and removably secured therein, said seed having an end thereof projecting from the first end of the chuck, said seed having a transverse notch extending into a side surface of the seed, said notch being at least partially defined by a latch surface having at least a portion in engagement with the support surface portion at an angle of contact;
    the latch pin further comprising a shaft and a pillow positioned between the shaft and the latch surface of the seed, said pillow defining said support surface and having a modulus of elasticity less than a modulus of elasticity of the seed.

2. A device as set forth in claim 1 wherein the seed is in the form of an elongate rod with a longitudinal axis and said latch surface having a contour such that at least a portion of the latch surface lies at an angle of at least about 30° from the longitudinal axis of the rod.

3. A device as set forth in claim 2 wherein said pillow has a modulus of elasticity less than about $2.1 \times 10^6$ psi.

4. A device as set forth in claim 2 wherein said pillow has a second surface with a shape corresponding generally with the shape of the latch surface for engagement therewith.

5. A device as set forth in claim 2 wherein the angle of contact is at least about 30°.

6. A device as set forth in claim 5 wherein the angle of contact is in the range of about 30° through about 60°.

7. A device as set forth in claim 2 wherein the angle of contact is about 45°.

8. A device as set forth in claim 1 wherein the pillow has a modulus of elasticity less than about $2.1 \times 10^6$ psi.

9. A device as set forth in claim 1 wherein the modulus of elasticity of elasticity of the pillow is less than about 10% of the modulus of elasticity of the seed.

10. A device as set forth in claim 1 wherein said latch surface and second surface are generally arcuate in shape.

11. A device as set forth in claim 10 wherein said arcuate shape is generally an arc of a circle with the latch surface having a first radius and the second surface having a second radius.

12. A device as set forth in claim 11 wherein the first radius of the latch surface is larger than the second radius of the second surface by at least about 1.5% when unloaded.

13. A device as set forth in claim 11 wherein the latch surface has a radius of curvature in the range of about 5 mm through about 8 mm.

14. A device as set forth in claim 1 wherein the seed is made of silicon and the latch pin is made of refractory metal.

15. A device as set forth in claim 14 wherein the insert is made of graphite material.

16. A device as set forth in claim 14 wherein the latch pin is made of molybdenum.

17. A device as set forth in claim 16 wherein the latch pin comprises a flat engageable with the chuck for locating the latch pin about its longitudinal axis.

18. A device as set forth in claim 1 wherein the angle of contact of the latch pin and seed is selected to prevent the seed from locking by wedging of the seed crystal against the chuck.

19. A device as set forth in claim 1 wherein the latch pin is formed to engage the chuck for positively locating the latch pin in an orientation about its longitudinal axis relative to the chuck to position the support surface for engagement with the latch surface of the seed.

20. A latch pin for attaching a semiconductor seed crystal to a chuck used to support a semiconductor ingot during ingot growth, said latch pin comprising:
    an elongate shaft having a socket extending into the shaft and opening on an exterior surface of the shaft, said shaft being made of refractory metal; and
    a pillow removably mounted in the socket, said pillow having a first surface extending outwardly from the shaft and adapted for engagement with a portion of a semiconductor seed, said pillow having a modulus of elasticity of less than about $2.1 \times 100^6$ psi.

21. A latch pin as set forth in claim 20 wherein the first surface is generally arcuate.

22. A latch pin as set forth in claim 21 wherein the arcuate shape is generally an arc of a circle.

23. A latch pin as set forth in claim 20 wherein the pillow includes a key portion sized and shaped to fit in the socket, said pillow having opposite ends and said key having a bottom surface that extends in a convex arc between the opposite ends.

24. A device for suspending a semiconductor ingot during formation of the ingot, said device including:
    a chuck with a seed receiving socket extending generally longitudinally of the chuck and opening onto a first end thereof;
    a latch pin mounted in said chuck;
    a pillow mounted to said latch pin and having a support surface;

a seed positioned in the chuck socket and removably secured therein, said seed having an end thereof projecting from the first end of the chuck, said seed having a transverse notch extending into a side surface of the seed, said notch being at least partially defined by a latch surface having at least a portion in engagement with the support surface, said chuck, latch pin, pillow and seed each having a coefficient of thermal expansion with values of the coefficients of thermal expansion having variation therebetween of less than about 50%.

25. A device as set forth in claim 24 wherein the variation in the values of coefficients of thermal expansion is less than about 20%.

26. A device as set forth in claim 25 wherein the variation in the values of coefficients of thermal expansion is less than about 10%.

27. A device as set forth in claim 26 wherein the variation in the values of coefficients of thermal expansion is less than about 5%.

28. A device as set forth in claim 24 wherein the pillow and the seed each have a modulus of elasticity, the modulus of elasticity of the pillow being less than the modulus of elasticity of the seed.

29. A device as set forth in claim 24 wherein the latch pin is formed to engage the chuck for positively locating the latch pin in an orientation about its longitudinal axis relative to the chuck to position the support surface for engagement with the latch surface of the seed.

30. A device as set forth in claim 24 wherein the latch surface of the seed and the support surface of the latch pin engage each other at an angle of contact relative to the longitudinal axis of the chuck is selected to prevent the seed from locking by wedging of the seed crystal against the chuck.

31. A device as set forth in claim 24 wherein the latch surface of the seed has a greater radius of curvature than the support surface of the latch pin.

32. A device for suspending a semiconductor ingot during formation of the ingot, said device including:

a chuck with a seed receiving socket extending generally longitudinally of the chuck and opening onto a first end thereof;

a latch pin mounted in said chuck;

a pillow mounted on said latch pin and having a support surface;

a seed positioned in the chuck socket and removably secured therein, said seed having an end thereof projecting from the first end of the chuck, said seed having a transverse notch extending into a side surface of the seed, said notch being at least partially defined by a latch surface having at least a portion in engagement with the support surface;

the support surface of the pillow and the latch surface of the seed each having a radius of curvature, the radius of curvature of the support surface being less than the radius of curvature of the latch surface.

33. A device as set forth in claim 32 wherein the radius of the latch surface is larger than the radius of the support surface by at least about 1.5% when unloaded.

34. A device as set forth in claim 33 wherein the latch pin comprises a flat engageable with the chuck for locating the latch pin about its longitudinal axis.

35. A device as set forth in claim 32 wherein the latch pin is formed to engage the chuck for positively locating the latch pin in an orientation about its longitudinal axis relative to the chuck to position the support surface for engagement with the latch surface of the seed.

36. A device as set forth in claim 32 wherein the latch surface of the seed and the support surface of the latch pin engage each other at an angle of contact relative to the longitudinal axis of the chuck is selected to prevent the seed from locking by wedging of the seed crystal against the chuck.

37. A device for holding a seed of semiconductor material used to grow a semiconductor ingot, said device including:

a chuck with a seed receiving socket extending generally longitudinally of the chuck and opening onto a first end thereof;

a latch pin mounted on said chuck;

a pillow mounted on said latch pin and having a support surface adapted to engage the seed for holding the seed in the chuck as the semiconductor ingot is being grown;

the latch pin being formed to engage the chuck for positively locating the latch pin in an orientation about its longitudinal axis relative to the chuck to position the support surface for engagement with the seed.

38. A device as set forth in claim 37 wherein the latch pin comprises a flat engageable with the chuck for locating the latch pin about its longitudinal axis.

39. A device as set forth in claim 37 wherein the location of the latch pin about its longitudinal axis relative to the chuck is selected so that engagement of the latch pin with the seed is at an angle of contact which prevents the seed from locking by wedging of the seed crystal against the chuck.

* * * * *

UNITED STATES PATENT AND TRADEMARK OFFICE
CERTIFICATE OF CORRECTION

PATENT NO. : 6,238,483 B1
DATED : May 29, 2001
INVENTOR(S) : Carl F. Cherko

It is certified that error appears in the above-identified patent and that said Letters Patent is hereby corrected as shown below:

<u>Column 8, claim 9,</u>
Lines 7 and 8, "of elasticity of elasticity" should read -- of elasticity --.

<u>Column 8, claim 20,</u>
Line 50, "$2.1 \times 100^6$ psi." should read -- $2.1 \times 10^6$ psi. --.

Signed and Sealed this

Fourth Day of December, 2001

Attest:

NICHOLAS P. GODICI
Attesting Officer
*Acting Director of the United States Patent and Trademark Office*